United States Patent
Wirth

(10) Patent No.: US 9,082,944 B2
(45) Date of Patent: Jul. 14, 2015

(54) OPTOELECTRONIC SEMICONDUCTOR COMPONENT AND SCATTERING BODY

(75) Inventor: Ralph Wirth, Lappersdorf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/817,273

(22) PCT Filed: Aug. 4, 2011

(86) PCT No.: PCT/EP2011/063483
§ 371 (c)(1),
(2), (4) Date: Apr. 3, 2013

(87) PCT Pub. No.: WO2012/022628
PCT Pub. Date: Feb. 23, 2012

(65) Prior Publication Data
US 2014/0175478 A1  Jun. 26, 2014

(30) Foreign Application Priority Data
Aug. 20, 2010  (DE) .......... 10 2010 034 915

(51) Int. Cl.
*H01L 33/58* (2010.01)
*H01L 33/44* (2010.01)
*G02B 5/02* (2006.01)
*H01L 33/56* (2010.01)

(52) U.S. Cl.
CPC .......... *H01L 33/58* (2013.01); *G02B 5/0278* (2013.01); *H01L 33/56* (2013.01); *H01L 33/44* (2013.01); *H01L 2933/0091* (2013.01)

(58) Field of Classification Search
CPC ........................................ H01L 33/58
USPC .................................. 257/79–109
See application file for complete search history.

(56) References Cited

U.S. PATENT DOCUMENTS

| 7,391,046 B2 | 6/2008 | Tsutsumi et al. |
| 2001/0033722 A1 * | 10/2001 | Okada et al. .......... 385/94 |
| 2004/0198924 A1 | 10/2004 | Young et al. |

(Continued)

FOREIGN PATENT DOCUMENTS

| DE | 10 2005 013 785 A1 | 11/2005 |
| DE | 10 2006 051 746 A1 | 4/2008 |

(Continued)

OTHER PUBLICATIONS

The Japanese Examination Report issued on Nov. 26, 2013 in corresponding Japanese Patent Application No. 2013-514744.

(Continued)

*Primary Examiner* — Asok K Sarkar
*Assistant Examiner* — Dmitriy Yemelyanov
(74) *Attorney, Agent, or Firm* — DLA Piper LLP (US)

(57) ABSTRACT

An optoelectronic semiconductor component includes one or a plurality of optoeletonic semiconductor chips, and at least one scattering body including a radiation-transmissive matrix material and embedded therein scattering particles composed of a particle material and which is disposed downstream of at least one of the semiconductor chips, wherein, in the event of a temperature change, a difference in refractive index between the matrix material and the particle material changes, and the difference in refractive index between the matrix material and the particle material at a temperature of 300 K is at most 0.15.

14 Claims, 2 Drawing Sheets

(56) References Cited

U.S. PATENT DOCUMENTS

| | | | |
|---|---|---|---|
| 2005/0253130 A1* | 11/2005 | Tsutsumi et al. | 257/13 |
| 2006/0060882 A1 | 3/2006 | Ohe et al. | |
| 2006/0083013 A1* | 4/2006 | Wanninger et al. | 362/509 |
| 2008/0079015 A1 | 4/2008 | Krummacher | |
| 2008/0121911 A1* | 5/2008 | Andrews et al. | 257/98 |
| 2008/0158675 A1* | 7/2008 | Fukushige et al. | 359/500 |
| 2009/0243457 A1* | 10/2009 | Jung et al. | 313/1 |
| 2010/0025709 A1 | 2/2010 | Koseki et al. | |
| 2011/0291129 A1 | 12/2011 | Wirth | |

FOREIGN PATENT DOCUMENTS

| | | | | |
|---|---|---|---|---|
| DE | 10 2008 030 253 A1 | | 12/2009 | |
| DE | 102008030253 A1 | * | 12/2009 | H01L 33/50 |
| DE | 10 2008 057 347 A1 | | 5/2010 | |
| JP | 5-25397 | | 2/1993 | |
| JP | 2006-93277 | | 4/2006 | |
| JP | 2006-179804 | | 7/2006 | |
| JP | 2007-165508 | | 6/2007 | |
| JP | 2008-108835 | | 5/2008 | |
| JP | 2009-197185 | | 9/2009 | |
| JP | 2009-275196 | | 11/2009 | |
| JP | 2010-34292 | | 2/2010 | |
| WO | 2009/155907 A2 | | 12/2009 | |
| WO | 2010/083929 | | 7/2010 | |

OTHER PUBLICATIONS

J.H. Wray et al., "Refractive Index of Several Glasses as a Function of Wavelength and Temperature," Journal of the Optical Society of America, vol. 59, No. 6, Jun. 1969, pp. 774-776.

Toshio Watanabe et al., "Influence of humidity on refractive index of polymers for optical waveguide and its temperature dependence," Applied Physics Letters, vol. 72, No. 13, 30 Mar. 1998, pp. 1533-1535.

S. Chhajed et al., "Junction temperature in light-emitting diodes assessed by different methods," Proceedings of SPIE, vol. 5739, Jan. 2005, pp. 16-24.

English translation of Japanese Notice of Reasons for Rejection dispatched Dec. 2, 2014 from corresponding Japanese Patent Application No. 2013-514744.

* cited by examiner

OPTOELECTRONIC SEMICONDUCTOR COMPONENT AND SCATTERING BODY

RELATED APPLICATIONS

This is a §371 of International Application No. PCT/EP2011/063483, with an international filing date of Aug. 4, 2011 (WO 2012/022628, published Feb. 23, 2012), which is based on German Patent Application No. 10 2010 034 915.1, filed Aug. 20, 2010, the subject matter of which is incorporated herein by reference.

TECHNICAL FIELD

This disclosure relates to an optoelectronic semiconductor component and a scattering body for an optoelectronic semiconductor component.

BACKGROUND

There is a need for an optoelectronic semiconductor component which exhibits an approximately stable spectral emission characteristic and a scattering body for such a semiconductor component.

SUMMARY

I provide an optoelectronic semiconductor component including one or a plurality of optoelectronic semiconductor chips, and at least one scattering body including a radiation-transmissive matrix material and embedded therein scattering particles composed of a particle material and which is disposed downstream of at least one of the semiconductor chips, wherein, in the event of a temperature change, a different in refractive index between the matrix material and the particle material changes, and the difference in refractive index between the matrix material and the particle material at a temperature of 300 K is at most 0.15.

I also provide a light emitting diode including one or a plurality of optoelectronic semiconductor chips, and at least one scattering body including a radiation-transmissive matrix material and embedded therein scattering particles composed of a particle material and which is disposed downstream of at least one of the semiconductor chips, wherein, in the event of a temperature change, a difference in refractive index between the matrix material and the particle material changes, the difference in refractive index between the matrix material and the particle material at a temperature of 300 K is at most 0.15, at a temperature of 300 K to 375 K, the difference in refractive index between the matrix material and the particle material decreases as the temperature rises, at least one temperature of 375 K to 450 K, an average scattering cross section of the scattering particles for radiation generated in the semiconductor chip during operation is at most 25% of the average scattering cross section of the scattering particles at a temperature of 300 K, the matrix material includes a phenylized silicone, the particle material is glass, $BaF_2$, $CaF_2$, LiF or $MgF_2$, and an average diameter of the scattering particles is 1.5 µm to 5 µm.

I further provide a method of operating the semiconductor component, including setting a temperature-dependent scattering behavior of the scattering body such that a scattering cross section decreases as the temperature rises, and compensating for a temperature-dependent decrease in the efficiency of the semiconductor chip such that a radiation intensity of the semiconductor component is temperature-independent with a tolerance of at most 5%.

DETAILED DESCRIPTION

Figure 1:
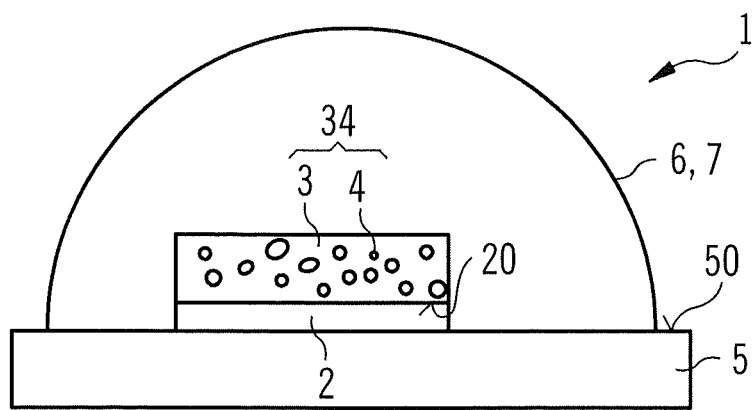
FIGS. 1 to 4 show schematic sectional illustrations of examples of optoelectronic semiconductor components with scattering bodies.

The optoelectronic semiconductor component may comprise one or a plurality of optoelectronic semiconductor chips. The semiconductor chips are, in particular, semiconductor chips based on a III-V semiconductor material. By way of example, the semiconductor chips are based on a nitride compound semiconductor material such as $Al_nIn_{1-n}Ga_mN$ or on $Al_nIn_{1-n}Ga_mP$, where in each case $0 \le n \le 1$, $0 \le m \le 1$ and $n+m \le 1$. In this case, the material can comprise one or more dopants and additional constituents. For the sake of simplicity, however, only the essential constituents of the crystal lattice, that is to say Al, Ga, In, N or P are specified, even if these can be replaced and/or supplemented in part by small amounts of further substances. Preferably, the optoelectronic semiconductor chips are designed to generate visible radiation, for example, in the blue, green, yellow and/or red spectral range, during operation of the semiconductor component. Generation of radiation preferably takes place in at least one active zone comprising at least one quantum well structure and/or at least one pn junction.

All the semiconductor chips of the semiconductor component can be structurally identical. Alternatively, it is possible for the semiconductor component to comprise different types of semiconductor chips based, in particular, on different semiconductor materials and preferably designed for emission in different spectral ranges.

The optoelectronic semiconductor component may be a light emitting diode, LED for short. In other words, the semiconductor component then emits incoherent radiation.

The optoelectronic semiconductor component may comprise at least one scattering body. The scattering body comprises a radiation-transmissive, preferably a pellucid and transparent matrix material into which scattering particles are embedded. The scattering particles consist of a particle material. The particle material is different from the matrix material.

The scattering body need not or approximately not be designed to change a spectrum of the radiation emitted by the semiconductor chip. In particular, the scattering body is free of a filter and/or free of a converter designed for partial or complete wavelength conversion of the radiation emitted by the semiconductor chip. Therefore, the scattering body is then designed exclusively or substantially for scattering and/or reflection and not for absorption or spectral conversion of the radiation emitted by the semiconductor chip.

The scattering body may be disposed downstream of at least one of the semiconductor chips. If the semiconductor component comprises a plurality of structurally identical semiconductor chips, then a common scattering body is disposed downstream of the semiconductor chips or, in particular, a dedicated scattering body is disposed downstream of each of the semiconductor chips. If the semiconductor component comprises semiconductor chips different from one another and not structurally identical, then it is possible for a scattering body to be disposed downstream of only a portion of the semiconductor chips. Disposed downstream means, in particular, that the scattering body succeeds the semiconductor chips along a main emission direction. The scattering body can be fitted directly at or on the semiconductor chip.

A difference in refractive index between the matrix material and the particle material may change in the event of a temperature change. In other words, a temperature-dependent profile of the refractive index of the matrix material may be different from a temperature-dependent profile of the refractive index of the particle material.

By way of example, the refractive index relative to the temperature in the relevant temperature range, both for the matrix material and for the particle material, may be describable approximately by a straight line. The straight lines describing the temperature-dependent refractive index of the matrix material and of the particle material can then have mutually different gradients. The gradients can have identical or else different signs.

The difference in refractive index between the matrix material and the particle material at a temperature 300 K may be at most 0.15, preferably at most 0.10, in particular at most 0.07 or at most 0.05. In particular, the difference in refractive index between the matrix material and the particle material is at least 0.02 at a temperature of 300 K and/or at most 0.01 at a temperature of 400K. That is to say that, at room temperature, the difference in refractive index between the matrix material and the particle material is comparatively small. However, the refractive indices preferably differ from one another such that the difference in refractive index is not equal to zero.

The optoelectronic semiconductor component may comprise one or a plurality of optoelectronic semiconductor chips, provided, in particular, for emission of visible light. Furthermore, the semiconductor component comprises at least one scattering body which comprises a radiation-transmissive, preferably a transparent, matrix material and embedded therein scattering particles composed of a particle material. The scattering body is disposed downstream of at least one of the semiconductor chips, in particular downstream thereof along a main emission direction of the semiconductor chip. In the event of a temperature change, a difference in refractive index between the matrix material and the particle material changes. At a temperature of 300 K, the difference in refractive index between the matrix material and the particle material is at most 0.15.

Optoelectronic semiconductor components such as light emitting diodes are operated at different temperatures. Upon switch-on, for example, an active zone of the semiconductor chip is approximately at ambient temperature, for example, room temperature. During a warm-up phase, the duration of which is dependent, in particular, on thermal resistances of the semiconductor chip and of the semiconductor component and is dependent on a coupling to a heat sink a temperature of the active zone rises until typically a stable temperature is reached at a steady-state operating point. In general, this process proceeds in a time period of the first 10 min to 30 min after switch-on. After the warm-up phase, the temperature is approximately 75° C. to 125° C., for example, wherein at the steady-state operating point the temperature can also be above 150° C.

In the case of material systems used for optoelectronic semiconductor chips, a luminous flux or a radiant flux typically changes depending on the temperature, particularly when a constant, temperature-independent current is present. Higher operating temperatures generally lead to a decrease in the luminous flux. For InGaN-based semiconductor chips, for example, the luminous flux at 100° C. is approximately 85% of the luminous flux at 25° C. In the case of InGaAlP-based semiconductor chips, this effect is all the more pronounced, in particular also since the emission wavelength shifts out of a range of relatively high eye sensitivity. Thus, in the case of an InGaAlP-based semiconductor chip which emits in the yellow spectral range, the brightness at 100° C. can fall to approximately 40% of the value at 25° C., and in the case of emission in the red wavelength range this fall can be approximately 50%, relative to the brightness perceived by the human eye.

This temperature dependence of the luminous flux can cause problems in applications. In the case of indicator lights or rear lights in the automotive sector, for example, a specific, predefined luminous flux has to be achieved. If the light emitting diodes are cold, near room temperature, then they emit light too brightly. In the case of general lighting of work spaces or living spaces, in particular semiconductor chips which emit greenish white are combined with red semiconductor chips or red, green, blue and/or yellow semiconductor chips are combined with one another. In the case of such a combination of differently emitting semiconductor chips and the comparatively great decrease, associated with a rising temperature, in the luminous flux of the red and, if appropriate, yellow LEDs, great color variations can occur. By way of example, the correlated color temperature changes by 600 K from approximately 2400 K at room temperature toward 3000 K at the steady-state operating point of the semiconductor chip at approximately 100° C. Therefore, light with a red cast is emitted after switch-on before the desired light color is attained only after approximately 10 min to 30 min. Furthermore, such temperature-dependent color changes extending over comparatively long periods of time can pose problems in the case of backlighting arrangements for liquid crystal displays, for instance.

Such a change in brightness or change in the spectral composition of the emitted radiation can be reduced or avoided by using so-called "full-conversion" light emitting diodes. In the case of these light emitting diodes, which are based, in particular, on the InGaN material system, radiation emitted in the semiconductor chip is completely converted into radiation having a different wavelength by a conversion material. However, such light emitting diodes are comparatively expensive. Furthermore, it is possible to electronically readjust the brightness and/or the spectral composition, for example. in conjunction with temperature sensors and/or optical sensors and subsequent electronic driving, for example, by pulse width modulation. However, these methods for readjustment are comparatively complex and complicated and relatively cost-intensive.

In the case of the optoelectronic semiconductor component specified, alternatively or additionally the temperature behavior of the luminous flux is influenced by the scattering body. As a result of the different temperature behavior of the refractive indices of matrix material and particle material, the difference in refractive index at room temperature changes in comparison with the difference in refractive index at the steady-state operating point, which is approximately 100° C., for example. The light-scattering properties of the scattering body change as a result of a change in the difference in refractive index. As a result, it is possible for the scattering body to effect scattering to a greater extent at room temperature and for the scattering behavior to decrease at higher temperatures. In other words, with the scattering body it is possible to compensate for a decrease in the luminous flux on account of the temperature-dependent efficiency of the semiconductor chip. As a result, the system comprising the scattering body and the semiconductor chip can achieve a light emission which is comparatively constant in the event of a temperature change.

The refractive index of the particle material at a temperature 300 K may be less than the refractive index of the matrix material.

The refractive index of the matrix material may decrease as the temperature increases. This applies, in particular, to a temperature range of 300 K to 450 K. Alternatively or additionally, the refractive index of the particle material increases as the temperature increases in this temperature range.

The difference in refractive index between the matrix material and the particle material decreases as the temperature increases. In particular, this applies in a temperature range of 300 K to 375 K and/or 375 K to 450 K.

A difference in refractive index between the matrix material and the particle material may increase at least in a temperature range of 300 K to 375 K and/or 375 K to 450 K.

The refractive indices of matrix material and particle material first match as the temperature increases in a temperature range of 300 K to 450 K and, subsequently, at even higher temperatures in or outside the stated temperature range, a difference in refractive index between the matrix material and the particle material increases again.

An average scattering cross section of the scattering particles in the temperature range of 375 K to 450 K is at most 50% or at most 25% or at most 10% of the average scattering cross section of the scattering particles at a temperature of 300 K. The average scattering cross section is dependent, inter alia, on the difference in refractive index between the particle material and the matrix material. Furthermore, geometrical properties of the scattering particles, in particular the shape of the scattering particles and the size thereof, influence the scattering cross section.

In other words, the refractive indices of the matrix material and of the particle material may approximate one another insofar as the scattering cross section in the range of the steady-state operating temperature of the semiconductor chip, that is to say, for example, at a temperature of 375 K to 450 K, is small or negligible in comparison with the scattering cross section of the scattering particles at room temperature. The scattering particles therefore have a scattering effect at room temperature, whereas the scattering particles have no or no significant scattering effect at the higher steady-state operating temperature of the semiconductor chip, on account of the changes in the refractive indices of the matrix material and, if appropriate, of the particle material.

The difference in refractive index between the matrix material and the particle material at a temperature of 300 K may be at least 0.02 or at least 0.025 or at least 0.03.

At the steady-state operating temperature, the difference in refractive index between the matrix material and the particle material may be at most 0.015, preferably at most 0.010 or at most 0.005. In particular, the difference in refractive index at a temperature of approximately 400 K, or at a steady-state operating temperature of the semiconductor chip that deviates therefrom, may be negligible or equal to zero.

The matrix material may comprise at least one of the following materials or may consist thereof or of a mixture of at least two of the following materials: a silicone, an epoxide, a polyurethane, an acrylate, a polycarbonate.

The particle material may be transparent and pellucid in a temperature range of 300 K to 450 K. By way of example, the particle material may comprise or is one of the following materials: a silicon oxide such as glass or a metal fluoride such as calcium fluoride, barium fluoride, lithium fluoride or magnesium fluoride.

An average diameter of the scattering particles may be at least 0.15 μm or at least 0.2 μm or at least 1.5 μm or at least 2 μm or at least 5 μm. Alternatively or additionally, the average diameter may be at most 20 μm, in particular at most 15 μm or at most 10 μm or at most 5 μm. The average diameter may be in this case, in particular, the diameter $d_{50}$ over $Q_0$.

A proportion by weight of the scattering particles in the entire scattering body may be 10% to 50%, in particular 20% to 40% or 25% to 35% or 15% to 30%. Alternatively or additionally, a proportion by volume of the scattering particles is less than 30% or less than 25% or less than 20%.

The scattering body may be shaped in a lamina-like or disc-like fashion. By way of example, the scattering body then extends over a radiation main area of the semiconductor chip with a constant or substantially constant thickness, wherein flanks of the semiconductor chip can likewise be covered by the scattering body. A thickness of the layer or of the lamina is preferably at most 500 μm or at most 100 μm.

The scattering body may be shaped in a lens-like fashion. By way of example, the scattering body has the form of a converging lens. The scattering body can therefore be embodied in a spherical or ellipsoidal fashion.

Proceeding from a temperature of 300 K, the refractive index of the matrix material may match the refractive index of the particle material, at least up to a temperature of 375 K. In other words, the refractive index of the matrix material may change to a greater extent than the refractive index of the particle material. By way of example, the refractive index of the particle material remains approximately constant and to an approximation only the refractive index of the matrix material changes. By way of example, a temperature-dependent change in the refractive index of the particle material is less than the change in the refractive index of the matrix material by at least a factor of 10 or by at least a factor of 50, relative to the same temperature range. In this case, the relative temperature range is, in particular, 300 K to 375 K and/or 375 K to 450 K.

The luminous flux thereof may be constant or virtually constant in particular 300 K to 375 K and/or 375 K to 450 K. By way of example, the luminous flux changes in the indicated temperature ranges at most by 25% or at most by 15% or at most by 5%, relative to a luminous flux of the semiconductor component at 300 K.

The scattering body may have a scattering effect shortly after switch-on, for example, at least up to 1 min or at least up to 5 min after switch-on at room temperature. In other words, to an observer the scattering body then appears turbid, such that structures situated below the scattering body, in particular, for example, a current spreading structure of the semiconductor chip, may appear blurred.

The scattering body, in particular during the intended use of the semiconductor component may be pellucid and/or transparent. To an observer the scattering body then does not appear turbid.

The scattering body no longer necessarily has a scattering effect a relatively long time after switch-on, for example, after 10 min or after 30 min or after a steady-state operating temperature has been set. In other words, to an observer the scattering body then appears pellucid.

I also provide a scattering body for an optoelectronic semiconductor component. By way of example, the semiconductor component, as described in at least one of the preceding examples, comprises such a scattering body. Therefore, features of the scattering body are also disclosed for the optoelectronic semiconductor component, and vice versa.

The scattering body may comprise a radiation-transmissive matrix material. Scattering particles composed of a particle material may be embedded into the matrix material. A refractive index of the matrix material may behave differently than a refractive index of the particle material in the case of a temperature change. At a temperature of 300 K, the difference in refractive index between the matrix material and the particle material may be at most 0.15.

Furthermore, I provide a method for operating an optoelectronic semiconductor component, in particular for a semiconductor component as in conjunction with one or with a plurality of the examples presented above. Therefore, features of the scattering body and of the optoelectronic semiconductor component are also disclosed for the method, and vice versa.

In the method, the semiconductor component may be operated such that a temperature-dependent scattering behavior of the scattering body is set such that a scattering cross section decreases as the temperature rises, wherein a temperature-dependent decrease in the efficiency of the semiconductor chip is compensated for, such that a radiation intensity of the semiconductor component is temperature-independent with a tolerance of at most 5%.

An optoelectronic semiconductor component and a scattering body are explained in greater detail below on the basis of examples with reference to the Drawings. In this case, identical reference signs indicate identical elements in the individual Drawings. In this case, however, relations to scale are not illustrated. Rather, individual elements may be illustrated with an exaggerated size to afford a better understanding.

FIG. 1 illustrates an example of an optoelectronic semiconductor component 1. An optoelectronic semiconductor chip 2 is fitted on a carrier 5. A scattering body 34 is situated at a radiation main area 20 of the semiconductor chip 2 facing away from the carrier 5. The scattering body 34 comprises a matrix material 3, which is pellucid and transparent to a radiation to be emitted by the semiconductor chip 2 and into which scattering particles 4 are embedded. The scattering body 34 is shaped in a lamina-like fashion and, for example, adhesively bonded or directly printed onto the radiation main area 20.

The matrix material 3 is, for example, a silicone or a silicone-epoxide hybrid material, in particular comprising a phenylized silicone. A refractive index of the matrix material 3 at room temperature is approximately 1.49, for example. The scattering particles 4 are, for example, glass beads having an average diameter of approximately 0.5 μm and a refractive index of 1.46 at room temperature. A proportion by weight of the scattering particles 4 in the scattering body 34 is approximately 30%.

The semiconductor chip 2, which is based, in particular, on InGaAlP, has a steady-state operating temperature in continuous operation, for example, at 100° C. Relative to room temperature at approximately 25° C., this means a temperature difference of 75° C. A change in refractive index of the silicone is approximately $-4 \times 10^{-4}$ $K^{-1}$ in the relevant temperature range. A refractive index of the silicone therefore decreases as the temperature increases. A change in refractive index of the scattering particle 3 is approximately $0.1 \times 10^{-5}$ $K^{-1}$ to $1 \times 10^{-5}$ $K^{-1}$ and, in comparison with the change in refractive index of the matrix material 3, is small and can be regarded as approximately constant.

On account of the difference in refractive index between the matrix material 3 and the scattering particles 4 of approximately 0.03 at room temperature, the scattering body 34 has a scattering effect at room temperature. This leads to backscattering of light from the semiconductor chip 2. The backscattered light is absorbed, for example, at the carrier 5 or in the semiconductor chip 2. At room temperature, a coupling-out efficiency of radiation generated in the semiconductor chip 2 out of the entire semiconductor component 1 is therefore reduced in a targeted manner.

Toward the steady-state operating temperature, the refractive index of the matrix material 3 approximates the refractive index of the scattering particles 4 and both refractive indices are then approximately 1.46. As a result, the scattering body 34, at the steady-state operating temperature of approximately 100° C., no longer or approximately no longer has a scattering effect and a coupling-out efficiency is increased at this temperature. By virtue of the temperature-dependent profile of the coupling-out efficiency on account of the change in refractive index of the matrix material 3 relative to the scattering particles 4, a stable luminous flux which is comparatively insensitive to temperature changes can be obtained.

In accordance with FIG. 1, the scattering particles 4 are approximately spherical. As an alternative or in addition thereto, scattering particles 4 can have angular shapes, for example, parallelepipedal or cubic or pyramidal, as also in all other examples. Non-spherical scattering particles 4 have a larger scattering cross section than spherical scattering particles 4 having the same average diameter. The scattering cross section can also be adapted by means of the diameter of the scattering particles 4. Thus, the average diameter of the scattering particles 4 can be in the range of the wavelength of the radiation emitted by the semiconductor chip 2, that is to say, for example, 400 nm to 700 nm.

In comparison with conventional scattering bodies, the scattering particles 4 have a small difference in refractive index relative to the matrix material 3 at room temperature. In the case of conventional scattering bodies, the scattering particles are formed, in particular, with an aluminum oxide, zirconium oxide or titanium oxide and a difference in refractive index between a matrix material and such particles is generally greater than 0.3.

Optionally, the lamina-like scattering body 34 is surrounded by a further potting body 6. The potting body 6 is preferably shaped in a lens-like fashion, for example in the form of a converging lens. A converter 7 that partly changes the wavelength of radiation generated in the semiconductor chip 2 can furthermore optionally be admixed with the potting body 6.

The following Drawings do not depict the scattering particles 4 and the matrix material 3, but rather only the scattering body 34 as a whole in a simplified fashion.

Figure 2A:
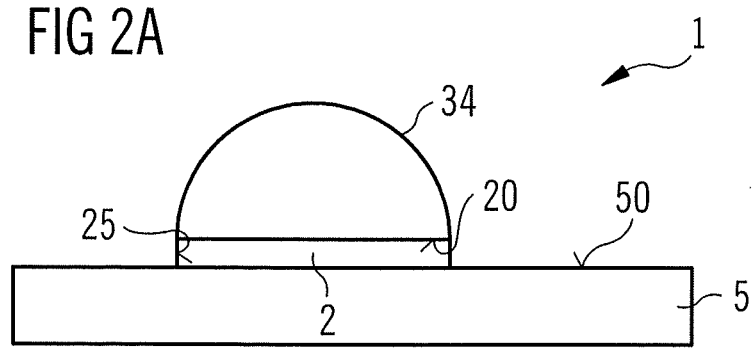
Figure 2B:
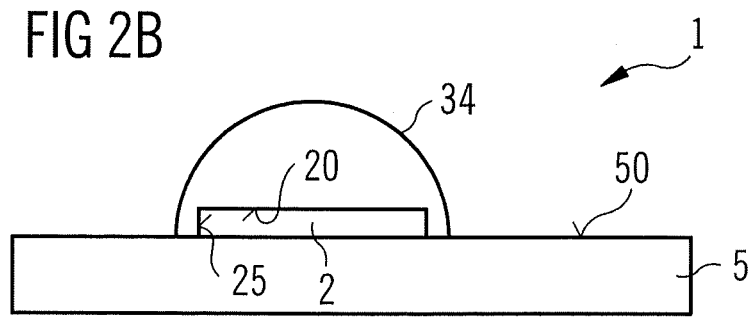

FIGS. 2A and 2B illustrate further examples of the semiconductor component 1. In accordance with FIG. 2A, the scattering body 34 exclusively covers the radiation main area 20 of the semiconductor chip 2. Therefore, the scattering body 34 is not in contact with a carrier top side 50 of the carrier 5, the semiconductor chip 2 being fitted to the carrier top side 50.

In accordance with FIG. 2B, the scattering body 34 has substantially the same dimensions as the semiconductor chip 2 in a lateral direction. In this case, substantially can mean that in a lateral direction a dimension of the scattering body 34 exceeds a dimension of the semiconductor chip 2 along the same direction at most by 30%, in particular at most by 20% or at most by 15%. In accordance with FIG. 2B the scattering body 34, having a laterally larger extent than the semiconductor chip 2, covers flanks 25 of the semiconductor chip 2, wherein the flanks 25 form lateral boundary areas of the semiconductor chip 2.

Figure 3A:
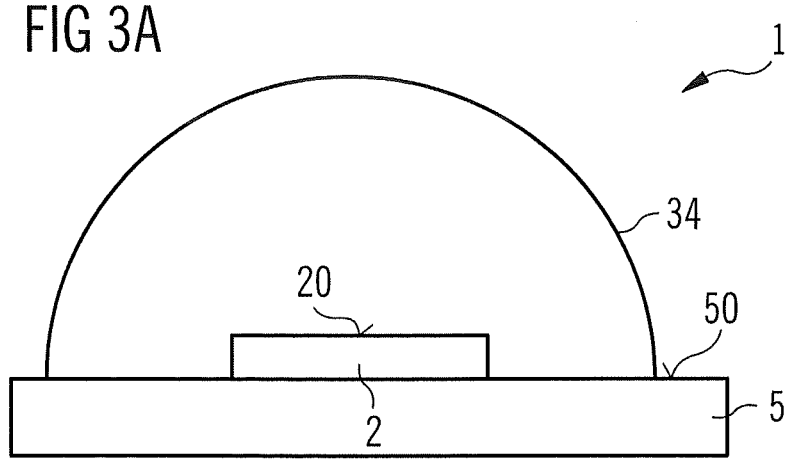
Figure 3B:
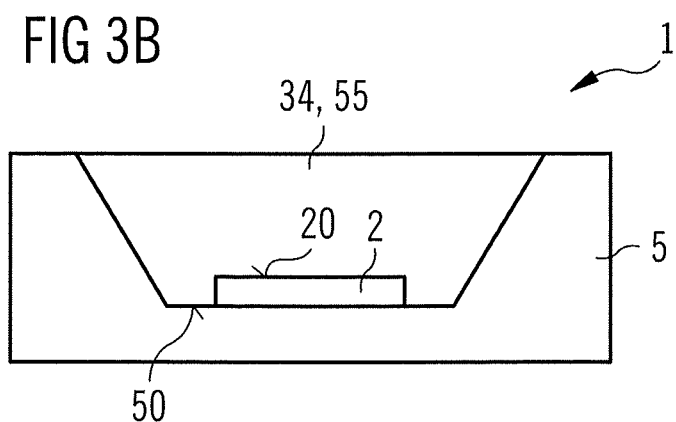

In the examples in accordance with FIGS. 3A and 3B, the scattering body 34 is fashioned as a volume potting. In FIG. 3A, the scattering body 34 is spherical or lens-like, wherein a lateral extent of the scattering body 34 exceeds a lateral extent of the semiconductor chip 2, for example, by more than a factor of 1.5 or by more than a factor of 2. A height of the scattering body 34, in a direction perpendicular to the carrier top side 50, exceeds, for example, an average edge length of the semiconductor chip 2.

In the example in accordance with FIG. 3B, the carrier 5 has a cutout 55 in which the semiconductor chip 2 is fitted. The cutout 55 is filled with the scattering body 34.

Figure 4:
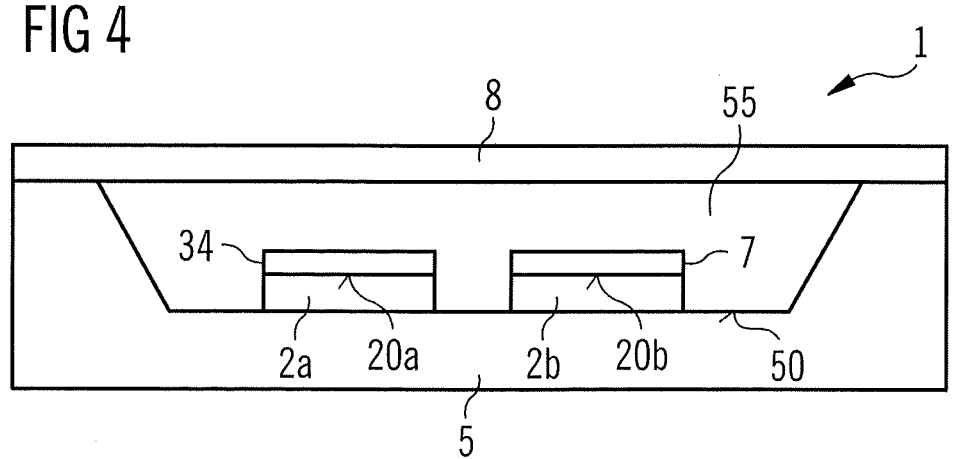

A further example is illustrated in FIG. 4. In accordance with FIG. 4, the optoelectronic semiconductor component 1 comprises a plurality of semiconductor chips 2a, 2b. By way of example, the semiconductor chip 2a is based on InAlGaP and emits radiation in the yellow or red spectral ranges. The semiconductor chip 2b is based, in particular, on AlInGaN and emits radiation in the blue spectral range. Both semiconductor chips 2a, 2b are fitted on the carrier top side 50 in the optional cutout 55 of the carrier 5.

The lamina-like scattering body 34 is disposed downstream of the semiconductor chip 2a at the radiation main area 20a. The semiconductor chip 2b is free of a scattering body. Optionally, a converter 7, for example, likewise embodied in a layered fashion like the scattering body 34, is fitted to the radiation main area 20b of the semiconductor chip 2b.

During operation, the semiconductor component 1 in accordance with FIG. 4 can emit white light, wherein, for example, greenish white light of the semiconductor chip 2b mixes with red light of the semiconductor chip 2a. A temperature dependence of the luminous flux of the semiconductor chip 2a can be compensated for by the scattering body 34 such that the semiconductor component 1 already emits radiation of the desired color temperature even directly after switch-on and before the steady-state operating temperature is reached.

A covering plate 8 is optionally disposed downstream of the semiconductor chips 2a, 2b. The covering plate 8 comprises a further scattering device, for example, which can improve a mixing of the radiation emitted by the semiconductor chips 2a, 2b.

The components described here are not restricted by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. An optoelectronic semiconductor component comprising:
   a plurality of optoelectronic semiconductor chips, and
   scattering bodies having different temperature-dependent scattering behavior disposed downstream of at least two of the semiconductor chips, wherein the scattering bodies comprise a radiation-transmissive matrix material and embedded therein scattering particles composed of a particle material, wherein
   the scattering bodies exclusively cover a radiation main area of the semiconductor chips so that the scattering body is not in contact with a carrier top side of a carrier on which the semiconductor chip is fitted,
   a temperature-dependent profile of the refractive index of the matrix material is different from a temperature-dependent profile of the refractive index of the particle material, and
   the difference in refractive index between the matrix material and the particle material at a temperature of 300 K is at most 0.15.

2. The optoelectronic semiconductor component according to claim 1, wherein, at a temperature of 300 K, the particle material has a lower refractive index than the matrix material.

3. The optoelectronic semiconductor component according to claim 1, wherein, at a temperature of 300 K to 450 K, a refractive index of the matrix material decreases as temperature rises.

4. The optoelectronic semiconductor component according to claim 1, wherein, at a temperature of 300 K to 450 K, the refractive index of the particle material increases as temperature rises.

5. The optoelectronic semiconductor component according to claim 1, wherein, at a temperature of 300 K to 375 K, the difference in refractive index between the matrix material and the particle material decreases as temperature rises.

6. The optoelectronic semiconductor component according to claim 1, wherein, at least one temperature of 375 K to 450 K, an average scattering cross section of the scattering particles for radiation generated in the semiconductor chip during operation is at most 25% of the average scattering cross section of the scattering particles at a temperature of 300 K.

7. The optoelectronic semiconductor component according to claim 1, wherein the difference in refractive index between the matrix material and the particle material is at least 0.02 at a temperature of 300 K and at most 0.01 at a temperature of 400 K.

8. The optoelectronic semiconductor component according to claim 1, wherein the matrix material comprises or is one of the following materials or a mixture of at least two of the following materials: a silicone, an epoxide, a polyurethane, an acrylate, a polycarbonate.

9. The optoelectronic semiconductor component according to claim 1, wherein the particle material is transparent and pellucid at a temperature of 300 K to 450 K.

10. The optoelectronic semiconductor component according to claim 1, wherein the particle material comprises or is one of the following materials or a mixture of at least two of the following materials: a silicon oxide, a metal fluoride.

11. The optoelectronic semiconductor component according to claim 1, wherein an average diameter of the scattering particles is 0.15 µm to 20 µm.

12. The optoelectronic semiconductor component according to claim 1, wherein a proportion by weight of the scattering particles in the scattering body is 10% to 50%.

13. The optoelectronic semiconductor component according to claim 1, wherein
   the matrix material is a silicone or a silicone-epoxide hybrid material,
   the particle material is glass, $BaF_2$, LiF or $MgF_2$,
   a proportion by weight of the scattering particles in the scattering body is 20% to 40%,
   an average diameter of the scattering particles is 0.2 µm to 5 µm,
   the scattering body is a lamina having a thickness of at most 500 µm or a converging lens,
   the semiconductor component comprises at least two semiconductor chips which emit in mutually different spectral ranges,
   up to a temperature of at least 375 K, proceeding from a temperature of 300 K, the refractive index of the matrix material matches the refractive index of the particle material, and
   at least one of the semiconductor chips is based on AlInGaN or on AlInGaP.

14. A light emitting diode comprising:
   a plurality of optoelectronic semiconductor chips, and
   scattering bodies having different temperature-dependent scattering behavior disposed downstream of at least two of the semiconductor chips, wherein the scattering bodies comprise a radiation-transmissive matrix material and embedded therein scattering particles composed of a particle material,
wherein
a temperature-dependent profile of the refractive index of the matrix material is different from a temperature-dependent profile of the refractive index of the particle material,
the difference in refractive index between the matrix material and the particle material at a temperature of 300 K is at most 0.15,
at a temperature of 300 K to 375 K, the difference in refractive index between the matrix material and the particle material decreases as the temperature rises,
at least one temperature of 375 K to 450 K, an average scattering cross section of the scattering particles for radiation generated in the semiconductor chip during operation is at most 25% of the average scattering cross section of the scattering particles at a temperature of 300 K,
the matrix material comprises a phenylized silicone,
the particle material is glass, $BaF_2$, $CaF_2$, LiF or $MgF_2$, and
an average diameter of the scattering particles is 1.5 μm to 5.

* * * * *

UNITED STATES PATENT AND TRADEMARK OFFICE
CERTIFICATE OF CORRECTION

| | | |
|---|---|---|
| PATENT NO. | : 9,082,944 B2 | Page 1 of 1 |
| APPLICATION NO. | : 13/817273 | |
| DATED | : July 14, 2015 | |
| INVENTOR(S) | : Wirth | |

It is certified that error appears in the above-identified patent and that said Letters Patent is hereby corrected as shown below:

In the Claims

In Column 10

At claim 6, line 14, please change "at least one" to -- at at least one --.

In Column 11

At claim 14, at line 15, please change "at least one" to -- at at least one --.

Signed and Sealed this
Fifteenth Day of March, 2016

Michelle K. Lee
*Director of the United States Patent and Trademark Office*